United States Patent [19]

Tanaka et al.

[11] Patent Number: 5,172,403
[45] Date of Patent: Dec. 15, 1992

[54] X-RAY EXPOSURE APPARATUS

[75] Inventors: Yutaka Tanaka, Yokohama; Nobutoshi Mizusawa, Yamato; Takao Kariya, Hino; Shunichi Uzawa, Nakamachi; Mitsuaki Amemiya, Atsugi, all of Japan

[73] Assignee: Canon Kabushiki Kaisha, Tokyo, Japan

[21] Appl. No.: 601,924

[22] Filed: Oct. 22, 1990

[30] Foreign Application Priority Data

Oct. 20, 1989 [JP] Japan .................. 1-271877

[51] Int. Cl.⁵ .......................... G21K 5/00
[52] U.S. Cl. ........................ 378/34; 378/35
[58] Field of Search .......... 378/34, 35; 250/491.1, 250/492.2

[56] References Cited

U.S. PATENT DOCUMENTS

| 4,185,202 | 1/1980 | Dean et al. | 378/34 |
| 4,403,336 | 9/1983 | Taniguchi et al. | 378/35 |
| 4,635,282 | 1/1987 | Okada et al. | 378/35 |
| 4,648,106 | 3/1987 | Novak | 378/34 |

FOREIGN PATENT DOCUMENTS

| 1-181518 | 7/1989 | Japan . | |
| 1-225118 | 9/1989 | Japan . | |
| 7900340 | 6/1979 | World Int. Prop. O. | 378/34 |

OTHER PUBLICATIONS

Patent Abstracts of Japan, Kokai No. 59-126632, vol. 8, No. 250, Nov. 1984.

Betz, "High Resolution Lithography Using Synchrotron Radiation," Nuclear Instruments & Methods in Physics Research, Section, A, vol. A 246, vol. 1/3, May 1986, pp. 658 through 667.

Primary Examiner—Janice A. Howell
Assistant Examiner—Don Wong
Attorney, Agent, or Firm—Fitzpatrick, Cella, Harper & Scinto

[57] ABSTRACT

An X-ray exposure apparatus for transferring a pattern of a mask to a wafer includes an X-ray source accommodating chamber; a mask chuck for supporting the mask; a wafer chuck for supporting the wafer; a stage for moving the wafer chuck; a stage accommodating chamber for accommodating therein the mask chuck, the wafer chuck and the stage; a barrel for coupling the X-ray source accommodating chamber with the stage accommodating chamber, to define an X-ray projection passageway; a blocking window provided in the X-ray projection passageway, for isolating the ambience in the X-ray accommodating chamber and the ambience in the stage accommodating chamber from each other; and a gas supply port contributable to fill the stage accommodating chamber with a gas ambience of low X-ray absorption, the gas supply port opening to the X-ray projection passageway, at a position between the blocking window and the mask supported by the mask chuck.

14 Claims, 5 Drawing Sheets

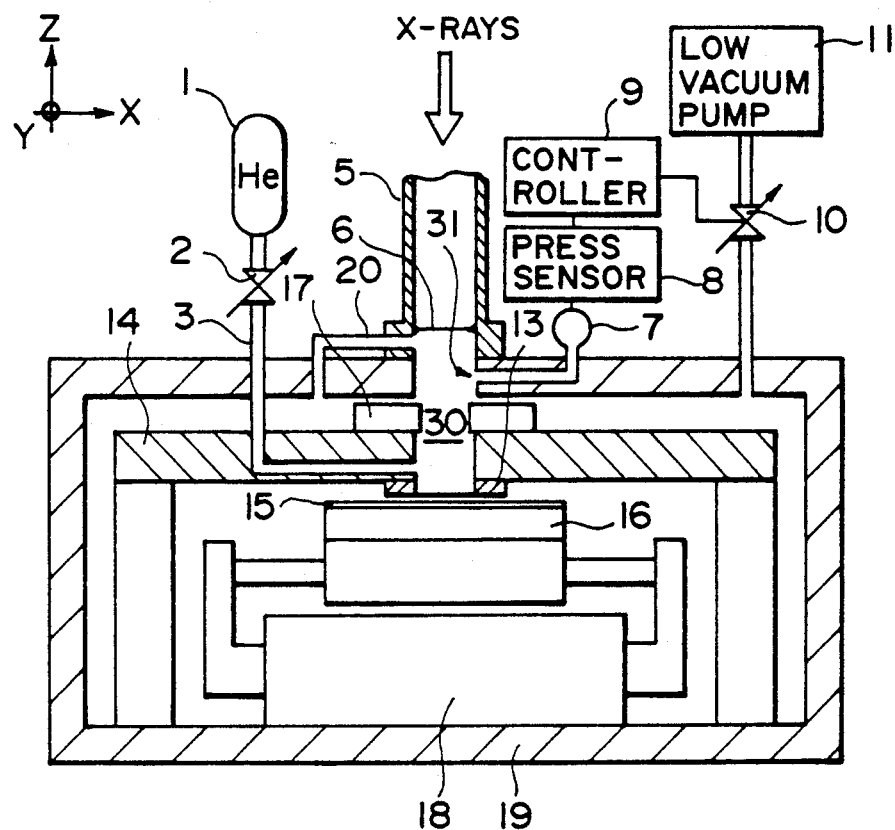
F I G. 4

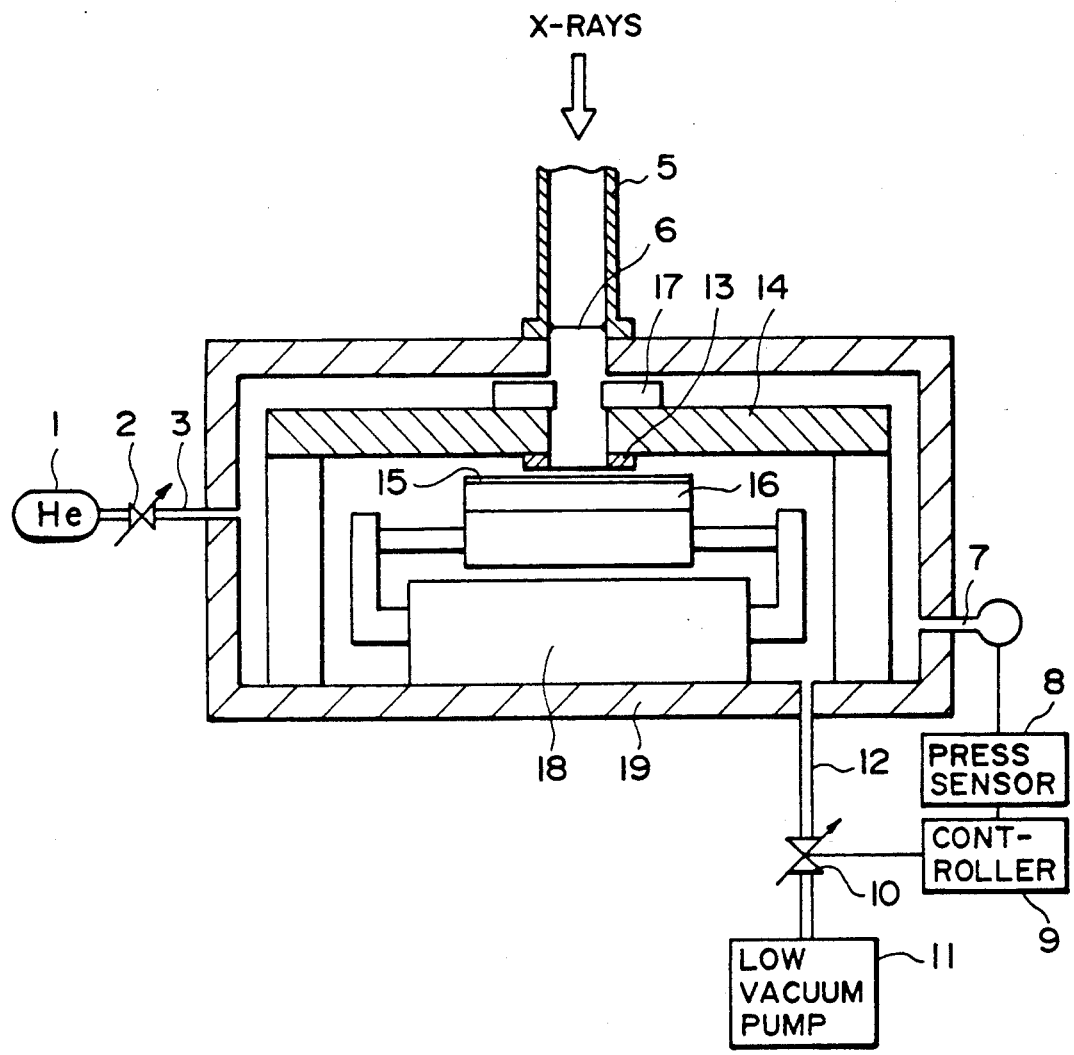
F I G. 6

X-RAY EXPOSURE APPARATUS

FIELD OF THE INVENTION AND RELATED ART

This invention relates to an X-ray exposure apparatus for lithographically transferring onto a semiconductor wafer a fine pattern of a semiconductor integrated circuit, by using soft X-rays.

As a light source of such an X-ray exposure apparatus, known are a bulb type one which produces X-rays by electron beam excitation, one which uses X-rays produced from plasma, one that uses synchrotron orbit radiation, and the like. All of these X-ray sources produce X-rays in vacuum. Accordingly, an X-ray source is usually disposed in a vacuum and gas-tight X-ray source accommodating chamber, and produced X-rays are projected to a mask or wafer through a blocking window made of a material (usually, beryllium (Be)) having a high X-ray transmission factor.

If in this case atmosphere is present in the path of X-ray transmission from the blocking window to a wafer, X-rays are absorbed by the atmosphere, resulting in an increase in exposure time and thus in a decrease of the throughput. Considering an X-ray exposure apparatus as an industrial productive machine, the decrease in throughput is a critical problem. In an attempt to solve this, a proposal has been made, in accordance with which an alignment mechanism for a mask and a wafer is disposed in a vacuum and gas-tight container chamber (hereinafter "stage accommodating chamber") and such stage accommodating chamber is filled with a particular gaseous fluid (usually, helium (He) gas) of reduced pressure, lower than the atmospheric pressure, having little X-ray absorbency (Japanese Patent Application No. 63-49849).

In this type of X-ray exposure apparatus, however, the amount of X-ray transmission through the path from the blocking window to the wafer is greatly affected by the helium gas ambience within the stage accommodating chamber. If the purity or pressure of helium introduced into the stage accommodating chamber changes largely, the amount of X-ray exposure changes, which results in reduction in precision of an exposure apparatus.

Additionally, it is necessary to retain the purity of helium at a high level and also to keep the variation thereof small. If it is desired to control the purity by using some purity detecting means, use of a very high precision detection and control means is necessary.

In that respect, an X-ray exposure apparatus has been proposed in U.S. patent application Ser. No. 07/417,054 filed Oct. 4, 1989, now copending U.S. patent application Ser. No. 07/733,977, filed Jul. 22, 1991, assigned to the same assignee of the subject application, which apparatus is arranged so that, even after the inside gas of a stage accommodating chamber is replaced by helium, a constant amount of helium is continuously supplied into the chamber to compensate for the reduction in the purity due to introduction of an impure gas into the stage accommodating chamber.

FIG. 6 shows this X-ray exposure apparatus.

In FIG. 6, a barrel 5 is coupled to an X-ray source (not shown) and, to this barrel 5, a stage accommodating chamber 19 is coupled. The barrel 5 is equipped with a beryllium blocking window 6 and the X-rays passing therethrough are used.

The stage accommodating chamber 19 accommodates therein a mask 13, a mask chuck 14, a wafer 15, a wafer chuck 16 and a wafer stage 18. To the stage accommodating chamber 19, a low vacuum pump 11 such as an oil rotation pump, for example, is coupled by way of a variable valve 10. The valve 10 is adapted to change the opening (conductance) thereof automatically in response to a signal from a controller 9. By means of a pressure sensor 8 and a pressure detecting port 7, the pressure within the stage accommodating chamber 19 can be detected and, on the basis of this detection, the controller 9 controls the opening of the variable valve 10. By this, the inside pressure of the stage accommodating chamber 19 is controlled and maintained constant.

Denoted at 1 is a helium tank and denoted at 2 is a valve the opening of which can be adjusted manually. The He gas can be supplied through a He supply port 3.

In this type of X-ray exposure apparatus, first the inside of the stage accommodating chamber 19 is vacuum evacuated to a predetermined pressure by using the low vacuum pump 11 and, thereafter, a helium gas is supplied to fill the stage accommodating chamber 19 with a reduced pressure helium ambience, and the exposure process is executed in this ambience.

SUMMARY OF THE INVENTION

In this example, the control of the helium ambience (purity and pressure) is conducted with respect to the entirety of helium gas in the stage accommodating chamber 19. However, since in the stage accommodating chamber 19, many elements such as the mask 13, the wafer 15, the mask chuck 14, the wafer chuck 16, the wafer stage 18 and the like are accommodated, it is not easy to correctly predict the flow of helium within the stage accommodating chamber 19. Also, when the wafer stage 18 moves, there is a possibility of the production of a regional flow. If this occurs, it is not possible to maintain the entire helium ambience in the stage accommodating chamber 19 uniform and, in the X-ray projection path from the beryllium blocking window 6 to the wafer 15 (to which the control is actually required), the purity of helium is liable to be degraded or the pressure thereof tends to change.

It is accordingly a primary object of the present invention to provide an X-ray exposure apparatus by which in the X-ray projection path the helium ambience can be maintained at a predetermined purity and a predetermined pressure, whereby high-precision X-ray exposure is ensured.

In accordance with an aspect of the present invention, a helium supplying port and a helium discharging port as well as a pressure detecting port are provided in the neighborhood of an X-ray projection path from a blocking window, to be passed by the X-rays, to the wafer. This makes it possible to execute weighted control of the helium ambience in the X-ray projection path in which the control is actually required. Additionally, a thin film may be provided between a mask and the blocking window to suppress vibration of the mask due to the gas flow of helium, to thereby ensure high precision exposure.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 4 is a schematic and diagrammatic view of an X-ray exposure apparatus according to a second embodiment of the present invention.

FIG. 6 is a schematic and diagrammatic view of an X-ray exposure apparatus of the type disclosed in a particular U.S. Patent Application.

DESCRIPTION OF THE PREFERRED EMBODIMENTS

Figure 1:
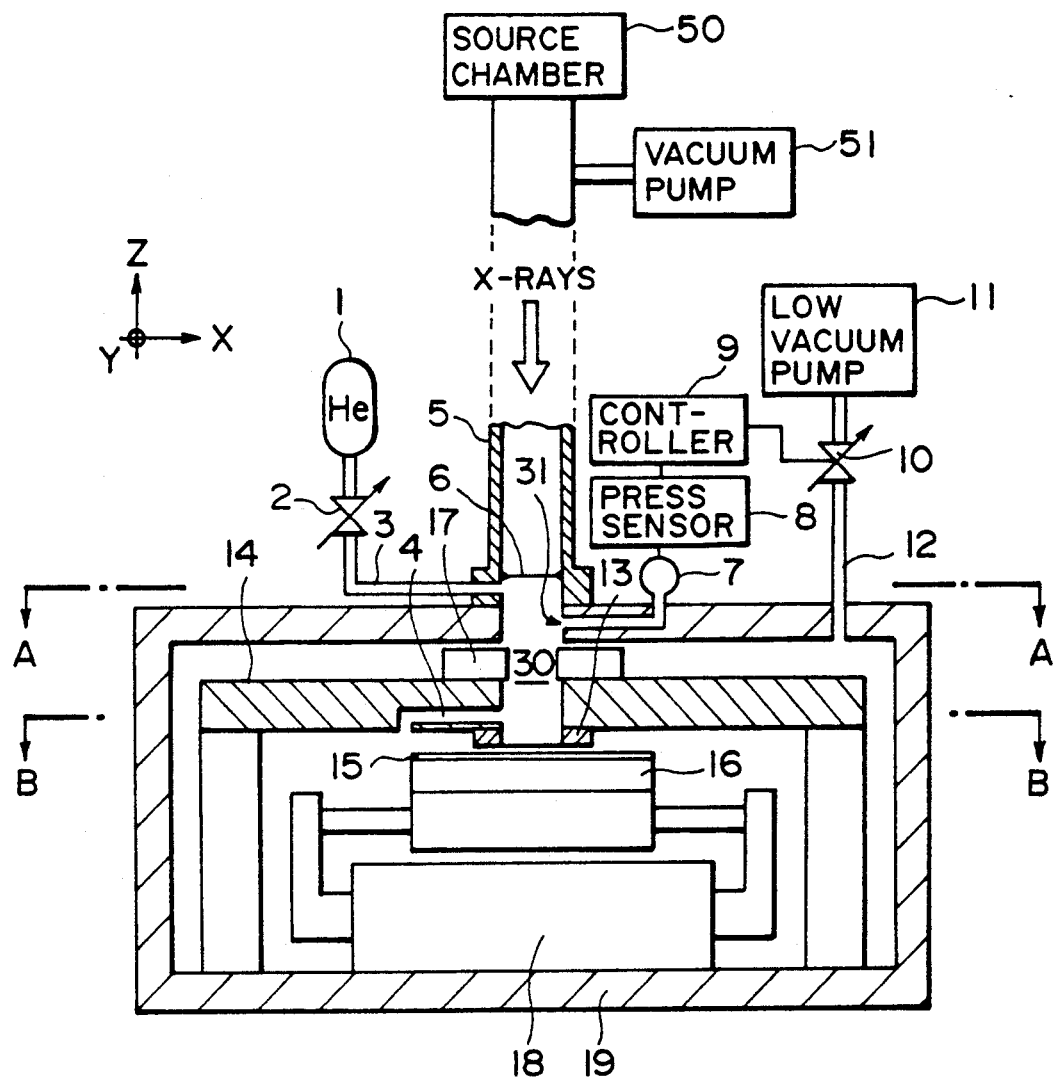
FIG. 1 is a schematic and diagrammatic view of an X-ray exposure apparatus according to a first embodiment of the present invention.

Referring to FIG. 1, denoted at 50 is an X-ray source accommodating chamber for accommodating an X-ray source therein. Barrel 5 is coupled to the X-ray source accommodating chamber and, to this barrel 5, a stage accommodating chamber 19 is coupled. The barrel 5 is equipped with a beryllium blocking window 6 through which the X-rays produced by the X-ray source are introduced into the stage accommodating chamber 19 along the z-axis direction.

The stage accommodating chamber 19 accommodates therein a mask 13, a mask chuck 14 for holding the mask 13, a semiconductor wafer 15, a wafer chuck 16 for holding the wafer 15, a wafer stage 18 which is movable along the x-axis, y-axis and z-axis directions as well as in rotational directions about these axes, respectively, and an optical system 17 for the alignment of the mask and the wafer with respect to each of the x-axis, y-axis and z-axis directions. More particularly, the optical system 17 is operable to detect any positional deviation between alignment marks provided on the mask and the wafer.

The wafer stage 18 can be moved stepwise in each of the x-axis and y-axis directions, for printing a circuit pattern formed on the mask 13 upon different shot areas on the wafer 15. By exposing the wafer 15 with the x-rays through the mask 13, the pattern of the mask 13 can be printed on a particular shot area of the wafer 15. Thus, the above-described structure constitutes what can be called an "X-ray stepper".

To the barrel 5, a high vacuum pump 51 such as a turbo molecular pump, for example, is coupled, for vacuum-evacuation thereof. To the stage accommodating chamber 19, a low vacuum pump 11 such as an oil rotation pump, for example, is coupled by way of a discharging port 12 and a variable valve 10. The discharging port 12 is coupled to the same side of the stage accommodating chamber 19, to which the barrel 5 is coupled. However, the discharging port may be coupled to the wall of the stage accommodating chamber 19 on the opposite side remote from the barrel 5, as in the FIG. 6 example.

The variable valve 10 is adapted to change the opening thereof automatically in response to a signal from a controller 9. The stage accommodating chamber 19 is equipped with an opening 31 for passage of X-rays, on the side of which opening a pressure detecting port 7 is provided to detect the pressure in an X-ray projection path 30 between the beryllium blocking window 6 and the mask 13. On the basis of the pressure detected by the pressure sensor 8, the controller 9 controls the opening of the variable valve 10. By this, the pressure in the stage accommodating chamber 19, more particularly, the pressure in the X-ray projection path (passageway) 30, can be controlled and maintained constant.

The flow of helium gas from a tank 1 is adjusted by a manual adjusting valve 2 to a predetermined flow rate and, through a helium supply port 3 disposed just after (wafer 15 side) the beryllium blocking window 6 of the barrel 5, the helium gas is supplied into the stage accommodating chamber 19 through the X-ray projection path 30.

The mask chuck 14 is provided with a helium discharging port 4 for discharging the supplied helium gas in the X-ray projection path 30 into the stage accommodating chamber 19. The helium discharging port 4 is arranged to avoid vibration or flexure of the mask 13 due to the gas flow of helium.

Figure 2:
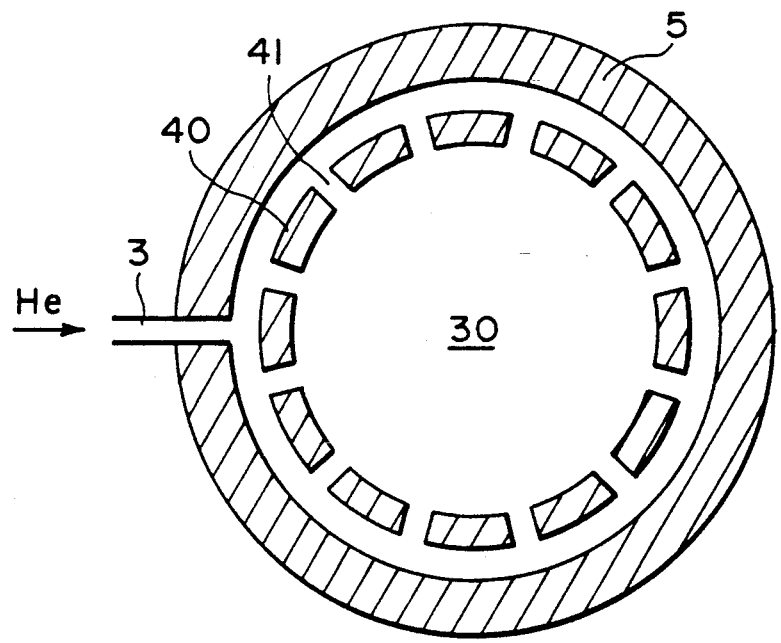
FIG. 2 is a sectional view showing a portion about a helium supplying port.
Figure 3:
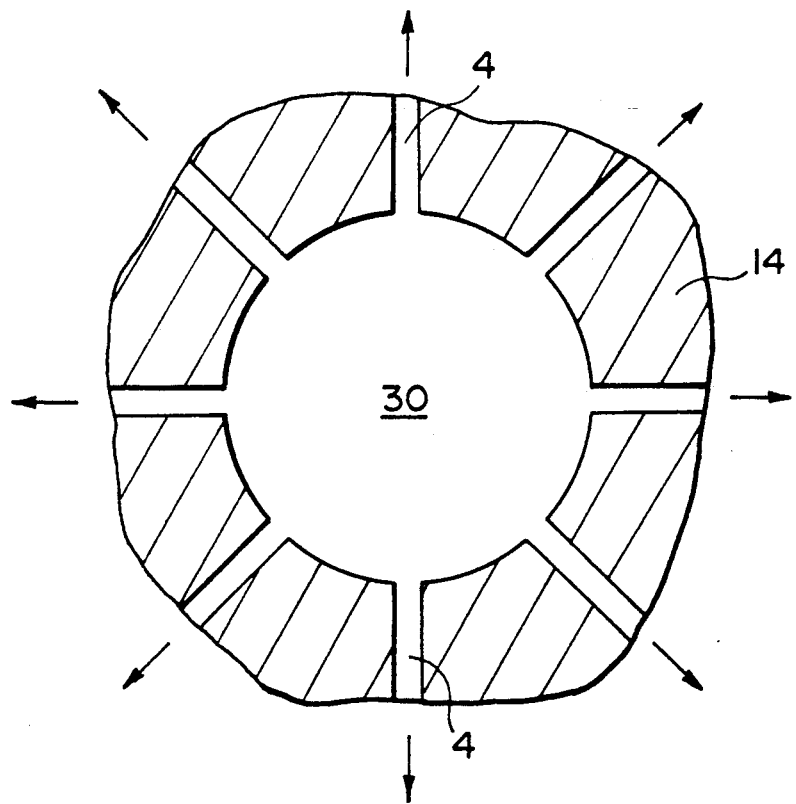
FIG. 3 is a sectional view showing a portion about helium discharging ports.

FIG. 2 is a sectional view of the helium supply port 3, taken on line A—A in FIG. 1. FIG. 3 is a sectional view of the helium discharging port 4, taken on line B—B in FIG. 1. As seen in these drawings, in the neighborhood of the portion of the barrel 5 to which the helium supply port 3 is coupled, an inner cylinder 40 is provided in a concentric relationship with the barrel 5. The inner cylinder 40 has twelve (12) bores 41 formed equidistantly along the circumference of the cylinder 40. The helium introduced into the barrel 5 from the helium supply port 3, is then introduced into the X-ray projection path 30 through these bores 41 of the inner cylinder 40. Also, as best seen in FIG. 3, the mask chuck 14 has eight (8) helium discharging ports 4 which are formed equidistantly around the X-ray projection path 30, as passageways extending radially outwardly from the center of the X-ray projection path 30. The helium introduced into the X-ray projection path 30, is then introduced into the stage accommodating chamber 19 through these discharging ports 4. By introducing and discharging the helium gas radially inwardly and outwardly in the manner described above, it is possible to obtain a uniform or homogeneous helium ambience.

For the exposure process in the X-ray exposure apparatus of the structure described above, first the inside atmosphere in the stage accommodating chamber 19 is replaced by a helium gas of a predetermined pressure. Then, in accordance with the quantity of impure gas introduction (leakage) into the stage accommodating chamber 19 (for example, the introduction of air through seal means), a constant amount of helium necessary for retaining the purity of helium in the stage accommodating chamber 19 is supplied continuously from the helium supply port 3. Additionally, the opening of the variable valve 10 coupled to the vacuum pump 10 is controlled continuously on the basis of the output of the pressure sensor 8. By this, the pressure in the X-ray projection path 30 can be controlled and maintained constant.

Referring to FIG. 4 showing a second embodiment of the present invention, helium is supplied through a helium supply port 3 which is provided just before (light source side) the mask 13 held on the mask chuck 14. Additionally, a communication port 20 is formed to provide communication between the stage accommodating chamber 19 and the barrel 5, more particularly, a part of the barrel 5 just after (mask 13 side) of the blocking window 6. The helium gas from the tank 1 flowing through the manual valve 2 flows through the X-ray projection path 30 in a direction from the mask 13 to the blocking window 6 and, thereafter, through the communication port 20 as the helium gas introduced into the stage accommodating chamber 19.

As in the first embodiment, the pressure detecting port 7 is provided on the side of the opening 31 of the stage accommodating chamber 19, for passage of X-rays, and it is operable to detect the pressure in the X-ray projection path 30. The remaining structure and operation of this embodiment are substantially the same as those of the first embodiment.

Figure 5:
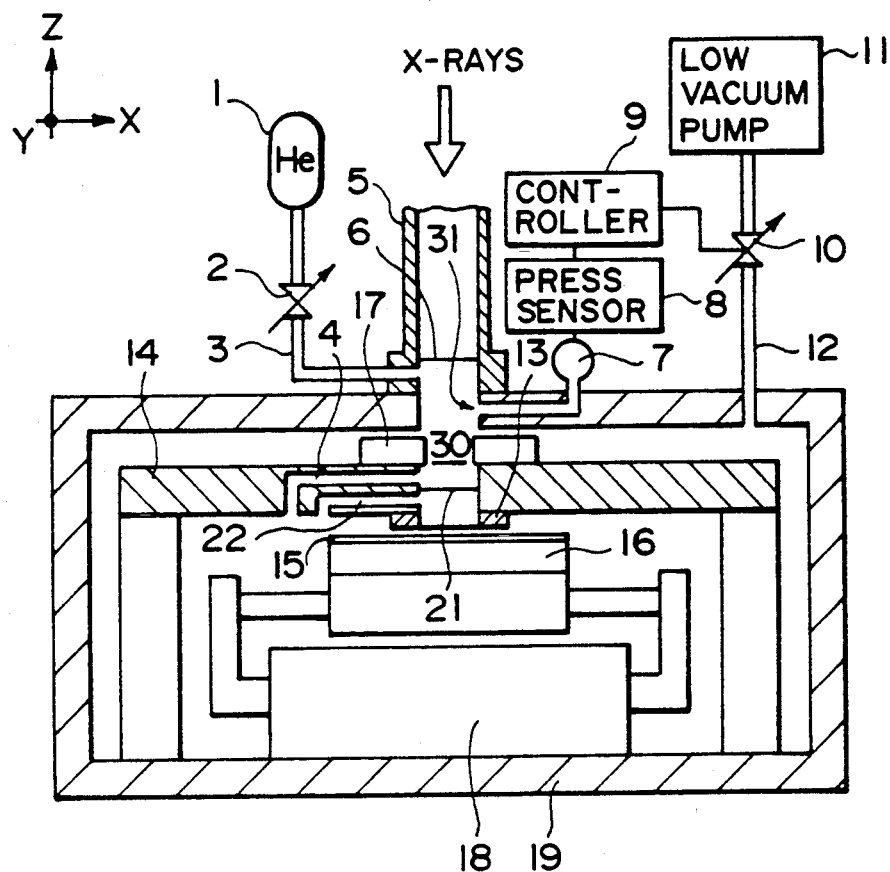
FIG. 5 is a schematic and diagrammatic view of an X-ray exposure apparatus according to a third embodiment of the present invention.

Referring to FIG. 5 showing a third embodiment of the present invention, in this embodiment, the first embodiment is modified such that a thin film 21 is added between the mask 13 and the helium discharging port 4 to intercept them. Also, a port 22 is added to provide communication between the stage accommodating chamber 19 and the space which is defined between the thin film 21 and the mask 13. With this arrangement, it is possible to effectively suppress or minimize the vibration or flexure of the mask 13 due to the flow of helium, substantially without decreasing the amount of exposure of the wafer 16 with the X-rays. In FIG. 5, the helium from the tank 1 flowing through the valve 2, is supplied into the stage accommodating chamber 19 from the helium supply port 3 provided just after the blocking window 6 of the barrel 5. More particularly, the helium gas introduced from the helium supply port 3 into the X-ray projection path 30 flows to the discharging ports 4 which are provided just before (blocking window 6 side) the thin film 21, into the stage accommodating chamber. Into the space between the thin film 21 and the mask 13, helium is introduced from the stage accommodating chamber 19 side, through the port 22.

The thin film 21 is disposed adjacent the helium discharging ports 4 which are formed in the mask chuck 14 for introduction of the helium gas supplied to the X-ray projection path 30, into the stage accommodating chamber 19. More particularly, it is disposed at one side of the ports 4 facing the mask 13. The communication port 22 provided between the thin film 21 and the mask 13 functions also to prevent the possible flexure or vibration of the thin film 21, due to the gas flow of helium, from adversely affecting the mask 13.

Since substantially no differential pressure is produced on the opposite sides of the thin film 21, the thickness thereof may be very small on an order of a few microns. Examples of the material thereof are: an organic material such as polypropylene, polyethylene, polyamide, polycarbonate, vinyl chloride, fluorine plastic or the like; or an inorganic material such as $Si_3N_4$, SiC, Be, $SiO_2$ or the like.

As in the first embodiment, the pressure detecting port 7 is provided on the side of the opening 31 of the stage accommodating chamber 19, for passage of X-rays and it is operable to detect the pressure in the X-ray projection path 30.

The remaining structure and operation are similar to those of the first embodiment. Also, in the third embodiment, like the second embodiment, the supply port 3 may be provided on the mask chuck side, at a position between the blocking window 6 and the thin film 21, and the communication port 20 (see FIG. 4) may be provided on the barrel 5 side. Whether the structure without a thin film 21 as in the first and second embodiments or the structure with a thin film as in the third embodiment should be selected, may be determined on the basis of various conditions such as, for example, the mechanical structure of the components (such as the barrel 5, the optical system 17, the mask 14, etc.) disposed around the X-ray projection path 30, the flow rate of helium gas as supplied from the helium supply port 3, the material and thickness of the thin film 21, while taking into account the quantity of X-ray attenuation, the effect of vibration or flexure of the mask, and the like.

In the preceding three embodiments, the supply and discharge of helium are executed through the ports 3 and 4 provided in the barrel 5 and the mask chuck 14, and the pressure detection is executed through the port 7 provided in the stage accommodating chamber 19. However, the present invention is not limited to such a form. By way of example, the supply port 3 may be provided in the stage accommodating chamber 19 so as to supply helium into the X-ray projection path 30, or the pressure detecting port 7 may be provided in the barrel 5 or the mask chuck 14 so as to detect the pressure in the X-ray projection path 30. Further, the position for the provision of the thin film 21 is not limited to the mask chuck 14.

According to the present invention, as described hereinbefore, it is possible to control the helium ambience in the X-ray projection path mainly, to which the control of purity, pressure and the like of the helium gas should actually be executed.

While the invention has been described with reference to the structures disclosed herein, it is not confined to the details set forth and this application is intended to cover such modifications or changes as may come within the purposes of the improvements or the scope of the following claims.

What is claimed is:

1. An X-ray exposure apparatus, usable with an X-ray source accommodated in an X-ray source accommodating chamber, for transferring a pattern of a mask to a wafer, said apparatus comprising:
   a mask chuck for supporting the mask;
   a wafer chuck for supporting the wafer;
   a stage for moving said wafer chuck;
   a stage accommodating chamber for accommodating therein said mask chuck, said wafer chuck and said stage;
   a barrel for coupling the X-ray source accommodating chamber with said stage accommodating chamber, to define an X-ray projection passageway;
   a blocking window provided in said X-ray projection passageway, for isolating ambience in the X-ray accommodating chamber from ambience in said stage accommodating chamber;
   a gas supply port opening into a portion of said X-ray projection passageway between said blocking window and the mask supported by said mask chuck, for introducing gas having low X-ray absorption into the portion to fill said stage accommodating chamber with the gas;
   a gas discharging port provided in said stage accommodating chamber; and
   discharging means for discharging the gas from said stage accommodating chamber through said gas discharging port.

2. An X-ray exposure apparatus, usable with an X-ray source accommodated in an X-ray source accommodating chamber, for printing a pattern of a mask on a wafer, said apparatus comprising:

a mask chuck for supporting the mask;
a wafer chuck for supporting the wafer;
a stage for moving said wafer chuck;
a stage accommodating chamber for accommodating therein said mask chuck, said wafer chuck and said stage;
a barrel for coupling the X-ray source accommodating chamber with said stage accommodating chamber, to define an X-ray projection passageway;
a blocking window provided in a portion of said X-ray projection passageway, for isolating ambience in the X-ray source accommodating chamber from ambience in said stage accommodating chamber;
a gas supply port for introducing gas having low X-ray absorption into said X-ray projection passageway from a portion of said barrel between said blocking window and the mask supported by said mask chuck;
a gas discharging port provided in said stage accommodating chamber; and
a pressure detecting port opening into a portion of said X-ray projection passageway between said blocking window and the mask supported by said mask chuck, for detecting pressure in said stage accommodating chamber.

3. An apparatus according to claim 2, wherein said gas supply port comprises a plurality of supplying openings disposed substantially uniformly around said X-ray projection passageway.

4. An apparatus according to claim 2, further comprising vacuum evacuating means actable on said stage accommodating chamber to maintain the pressure of the gas ambience detected through said pressure detecting port constant.

5. An apparatus according to claim 2, further comprising a gas discharging port for introducing, into said stage accommodating chamber, the gas supplied from said gas supply port into said X-ray projection passageway.

6. An apparatus according to claim 5, wherein, along said X-ray projection passageway, said gas supply port is disposed on the blocking window side while said gas discharging port is disposed on the mask chuck side.

7. An apparatus according to claim 5, wherein, along said X-ray projection passageway, said gas supply port is disposed on the mask chuck side, while said gas discharging port is disposed on the blocking window side.

8. An apparatus according to claim 5, wherein said gas supply port has a plurality of supplying openings disposed substantially uniformly around said X-ray projection passageway, and wherein said gas discharging port has a plurality of discharging openings disposed substantially uniformly around said X-ray projection passageway.

9. An apparatus according to claim 5, further comprising a blocking film disposed in said X-ray projection passageway, at a position between the opening position of said gas discharging port and the mask supported by said mask chuck.

10. An apparatus according to claim 9, further comprising a communication port for providing communication between said stage accommodating chamber and a portion of said X-ray projection passageway, between said blocking film and the mask held by said mask chuck.

11. A semiconductor device manufacturing method usable with an X-ray exposure system including an X-ray source for supplying X-rays, an X-ray projection passageway having a blocking window, and an exposure chamber for accommodating therein a mask and a wafer and being coupled to the X-ray projection passageway, said method comprising the steps of:
supplying gas including helium into a portion of the X-ray projection passageway between the blocking window and the mask in the exposure chamber;
introducing the supplied helium gas in the X-ray projection passageway into the exposure chamber;
exposing the mask and the wafer in the exposure chamber with X-rays supplied from the X-ray source and passing along the X-ray projection passageway and through the blocking window; and
discharging the helium gas, which has been supplied into the exposure chamber, out of the exposure chamber through an opening defined in the exposure chamber.

12. A method according to claim 11, further comprising providing a pressure detecting port which opens into a portion of the X-ray projection passageway between the blocking window and the mask in the exposure chamber, and detecting pressure in the exposure chamber through the pressure detecting port.

13. A method according to claim 12, further comprising vacuum-evacuating the exposure chamber to maintain the pressure detected through the pressure detecting port substantially at a predetermined level.

14. A method according to claim 11, wherein, in said gas supplying step, the helium gas is supplied into the X-ray projection passageway from inlet openings located substantially equiangularly around the X-ray projection passageway.

* * * * *

UNITED STATES PATENT AND TRADEMARK OFFICE
CERTIFICATE OF CORRECTION

PATENT NO. : 5,172,403
DATED : December 15, 1992
INVENTOR(S) : Yutaka Tanaka, et al.

It is certified that error appears in the above-identified patent and that said Letters Patent is hereby corrected as shown below:

On the Title Page:

UNDER ITEM "[75] Inventors"

The address of the fourth-named inventor, which reads "Nakamachi" should read --Setagaya--.

IN THE DISCLOSURE

COLUMN 4

Line 56, "pump 10" should read --pump 11--.

COLUMN 5

Line 49, "small" should read --small,--.

Signed and Sealed this

Seventeenth Day of January, 1995

Attest:

BRUCE LEHMAN

*Attesting Officer*  *Commissioner of Patents and Trademarks*